US012732151B2

(12) United States Patent
Inoue

(10) Patent No.: US 12,732,151 B2
(45) Date of Patent: Sep. 8, 2026

(54) ACOUSTIC WAVE DEVICE

(71) Applicant: Murata Manufacturing Co., Ltd., Nagaokakyo (JP)

(72) Inventor: Kazunori Inoue, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 701 days.

(21) Appl. No.: 18/209,516

(22) Filed: Jun. 14, 2023

(65) Prior Publication Data

US 2023/0327634 A1 Oct. 12, 2023

Related U.S. Application Data

(63) Continuation of application No. PCT/JP2021/046375, filed on Dec. 15, 2021.
(Continued)

(51) Int. Cl.
*H03H 9/02* (2006.01)
*H03H 9/125* (2006.01)
*H03H 9/17* (2006.01)

(52) U.S. Cl.
CPC ........ *H03H 9/02015* (2013.01); *H03H 9/125* (2013.01); *H03H 9/173* (2013.01)

(58) Field of Classification Search
CPC .... H03H 9/02015; H03H 9/125; H03H 9/173; H03H 9/02; H03H 9/02102; H03H 9/02228
See application file for complete search history.

(56) References Cited

U.S. PATENT DOCUMENTS 10,666,223 B2 * 5/2020 Iwamoto ............ H03H 9/02866
11,323,090 B2 * 5/2022 Garcia .................. H03H 9/174
(Continued)

FOREIGN PATENT DOCUMENTS

JP 2010109949 A 5/2010
JP 2012257019 A 12/2012
(Continued)

OTHER PUBLICATIONS

International Search Report in PCT/JP2021/046375, mailed Mar. 8, 2022, 3 pages.
(Continued)

*Primary Examiner* — Pedro J Cuevas
(74) *Attorney, Agent, or Firm* — Keating & Bennett, LLP

(57) ABSTRACT

An acoustic wave device includes a support substrate, a piezoelectric layer on the support substrate and including a main surface, a cavity portion between the support substrate and the piezoelectric layer, an IDT electrode on the main surface and including first and second busbars, and first and second electrode fingers respectively connected to the first and second busbars, a wiring electrode on the main surface and connected to the IDT electrode, and a high thermal conductive film in the piezoelectric layer and having a thermal conductivity higher than a thermal conductivity of the piezoelectric layer. A portion of the IDT electrode is in a region overlapping the cavity portion, the high thermal conductive film is in a region overlapping the cavity portion, and at least one of the IDT electrode and the wiring electrode is connected to the high thermal conductive film directly or via a metal.

20 Claims, 13 Drawing Sheets

Related U.S. Application Data

(60) Provisional application No. 63/126,556, filed on Dec. 17, 2020.

(56) References Cited

U.S. PATENT DOCUMENTS

| | | | | |
|---|---|---|---|---|
| 11,742,828 | B2 * | 8/2023 | Yantchev | H03H 9/02228 333/187 |
| 11,990,888 | B2 * | 5/2024 | Garcia | H03H 3/02 |
| 12,034,427 | B2 * | 7/2024 | Nagatomo | H03H 9/02015 |
| 12,289,094 | B2 * | 4/2025 | Yantchev | H03H 9/02228 |
| 12,301,209 | B2 * | 5/2025 | Nagatomo | H03H 9/02015 |
| 12,348,215 | B2 * | 7/2025 | Garcia | H03H 9/174 |
| 12,413,198 | B2 * | 9/2025 | Inoue | H03H 9/568 |
| 12,470,197 | B2 * | 11/2025 | Kimura | H03H 9/02015 |
| 12,531,536 | B2 * | 1/2026 | Kimura | H03H 9/02015 |
| 12,556,160 | B2 * | 2/2026 | Yantchev | H03H 9/02228 |
| 2010/0107388 | A1 | 5/2010 | Iwamoto | |
| 2014/0368296 | A1 | 12/2014 | Nishizawa | |
| 2019/0074815 | A1 * | 3/2019 | Iwamoto | H03H 9/02834 |
| 2019/0288669 | A1 | 9/2019 | Matsumoto et al. | |
| 2019/0357381 | A1 | 11/2019 | Maki et al. | |
| 2021/0408994 | A1 * | 12/2021 | Nagatomo | H03H 9/02228 |
| 2022/0407496 | A1 * | 12/2022 | Hill | H03H 9/14541 |
| 2023/0127479 | A1 * | 4/2023 | Nagatomo | H03H 9/02102 333/187 |
| 2023/0163747 | A1 * | 5/2023 | Nagatomo | H03H 9/02992 310/313 R |
| 2023/0170873 | A1 * | 6/2023 | Nagatomo | H03H 9/13 310/365 |
| 2023/0198495 | A1 * | 6/2023 | Ouchi | H03H 9/02228 310/313 A |
| 2023/0275554 | A1 * | 8/2023 | Inoue | H03H 9/02015 |
| 2023/0275562 | A1 * | 8/2023 | Kimura | H03H 9/175 |
| 2023/0283258 | A1 * | 9/2023 | Yantchev | H03H 9/02228 333/187 |
| 2023/0318563 | A1 * | 10/2023 | Ouchi | H03H 9/02228 310/349 |
| 2023/0327636 | A1 * | 10/2023 | Ouchi | H03H 9/02157 310/365 |
| 2023/0370047 | A1 * | 11/2023 | Ishii | H03H 9/02015 |
| 2023/0412139 | A1 * | 12/2023 | Kimura | H03H 9/02015 |
| 2024/0014799 | A1 * | 1/2024 | Nakao | H03H 9/605 |
| 2024/0030890 | A1 * | 1/2024 | Nakao | H03H 9/02228 |
| 2024/0030893 | A1 * | 1/2024 | Nakao | H03H 9/02062 |
| 2024/0258993 | A1 * | 8/2024 | Garcia | H03H 9/02157 |
| 2024/0333250 | A1 * | 10/2024 | Yamane | H03H 9/17 |
| 2024/0356525 | A1 * | 10/2024 | Yantchev | H03H 9/02228 |
| 2024/0413803 | A1 * | 12/2024 | Plesski | H03H 9/175 |
| 2025/0015784 | A1 * | 1/2025 | Nagatomo | H03H 9/173 |
| 2025/0023546 | A1 * | 1/2025 | Daimon | H03H 9/02228 |
| 2025/0023548 | A1 * | 1/2025 | Inoue | H03H 9/25 |
| 2025/0023553 | A1 * | 1/2025 | Okada | H03H 9/176 |
| 2025/0167760 | A1 * | 5/2025 | Nagatomo | H03H 9/02015 |

FOREIGN PATENT DOCUMENTS

| | | | |
|---|---|---|---|
| JP | 2015002511 | A | 1/2015 |
| JP | 2019205164 | A | 11/2019 |
| WO | 2016147687 | A1 | 9/2016 |
| WO | 2018105201 | A1 | 6/2018 |

OTHER PUBLICATIONS

Written Opinion in PCT/JP2021/046375, mailed Mar. 8, 2022, 3 pages.

* cited by examiner

FIG. 12
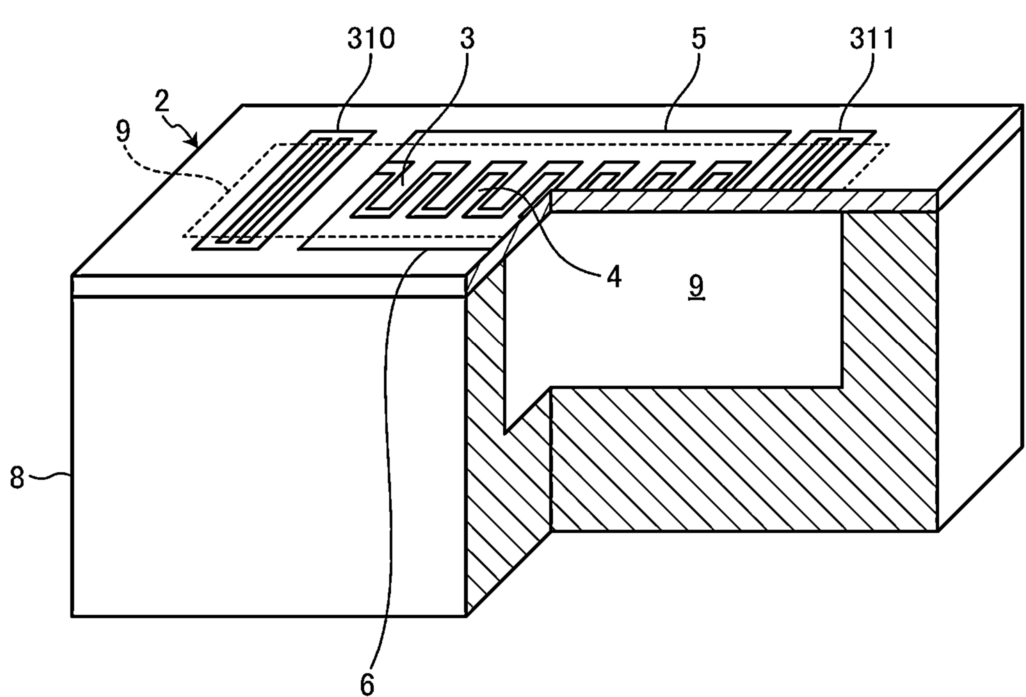
301
310
3
5
311
2
9
4
9
8
6

ACOUSTIC WAVE DEVICE

CROSS REFERENCE TO RELATED APPLICATIONS

This application claims the benefit of priority to Provisional Application No. 63/126,556 filed on Dec. 17, 2020 and is a Continuation Application of PCT Application No. PCT/JP2021/046375 filed on Dec. 15, 2021. The entire contents of each application are hereby incorporated herein by reference.

BACKGROUND OF THE INVENTION

1. Field of the Invention

The present invention relates to an acoustic wave device.

2. Description of the Related Art

Japanese Unexamined Patent Application Publication No. 2012-257019 discloses an acoustic wave device.

In the acoustic wave device disclosed in Japanese Unexamined Patent Application Publication No. 2012-257019, heat is generated in a piezoelectric layer by excitation of an electrode. In a case where the piezoelectric layer is stacked on a support substrate with a cavity portion interposed therebetween, there is a possibility that heat dissipation property is deteriorated and heat is accumulated.

SUMMARY OF THE INVENTION

Preferred embodiments of the present invention provide acoustic wave devices that are each able to reduce or prevent an accumulation of heat.

An acoustic wave device according to a preferred embodiment of the present invention includes a support substrate, a piezoelectric layer including lithium niobate or lithium tantalate on the support substrate in a thickness direction of the support substrate, and including a main surface in the thickness direction, a cavity portion between the support substrate and the piezoelectric layer, an IDT electrode on the main surface of the piezoelectric layer and including a first busbar and a second busbar that face each other, a plurality of first electrode fingers each including a base end connected to the first busbar, and a plurality of second electrode fingers each including a base end connected to the second busbar, a wiring electrode on the main surface of the piezoelectric layer and connected to the IDT electrode, and a high thermal conductive film on the piezoelectric layer in the thickness direction and having a thermal conductivity higher than a thermal conductivity of the piezoelectric layer, wherein at least a portion of the IDT electrode is provided in a region overlapping the cavity portion in a plan view in the thickness direction, the high thermal conductive film is provided in a region overlapping the cavity portion in a plan view in the thickness direction, and the IDT is connected to the high thermal conductive film directly or via a metal.

According to preferred embodiments of the present invention, accumulation of heat is reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 12 is a partially cutaway perspective view for explaining an acoustic wave device according to a preferred embodiment of the present invention.

DETAILED DESCRIPTION OF THE PREFERRED EMBODIMENTS

Hereinafter, preferred embodiments of the present disclosure will be described in detail with reference to the drawings. The present disclosure is not limited to the preferred embodiments. Each preferred embodiment described in the present disclosure is an example, and modifications in which partial replacement or combination of configurations are possible, and in a second and subsequent preferred embodiments, description of matters common with a first preferred embodiment will be omitted and only different points will be described in different preferred embodiments. In particular, the same or similar functions and advantageous effects obtained by the same or similar configurations will not be described in each preferred embodiment.

First Preferred Embodiment

Figure 1A:
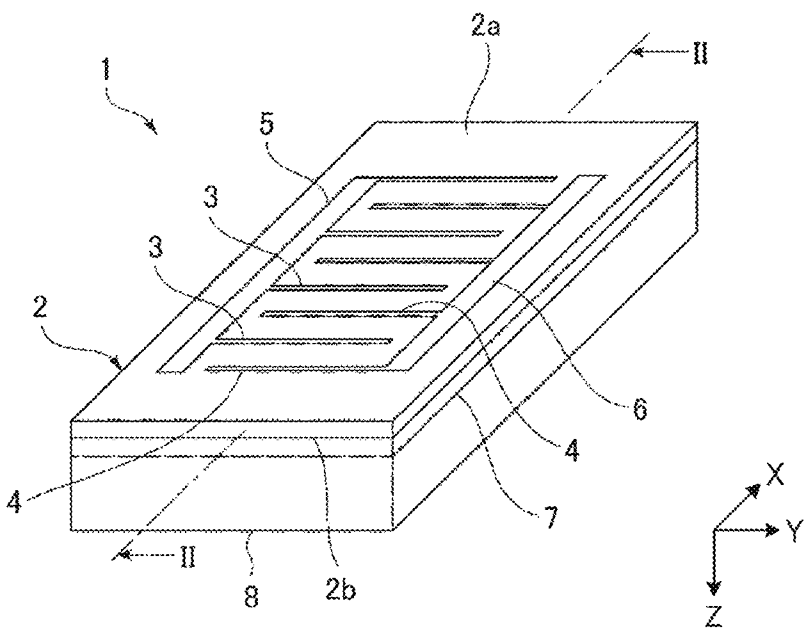
FIG. 1A is a perspective view illustrating an acoustic wave device according to a first preferred embodiment of the present invention.
Figure 1B:
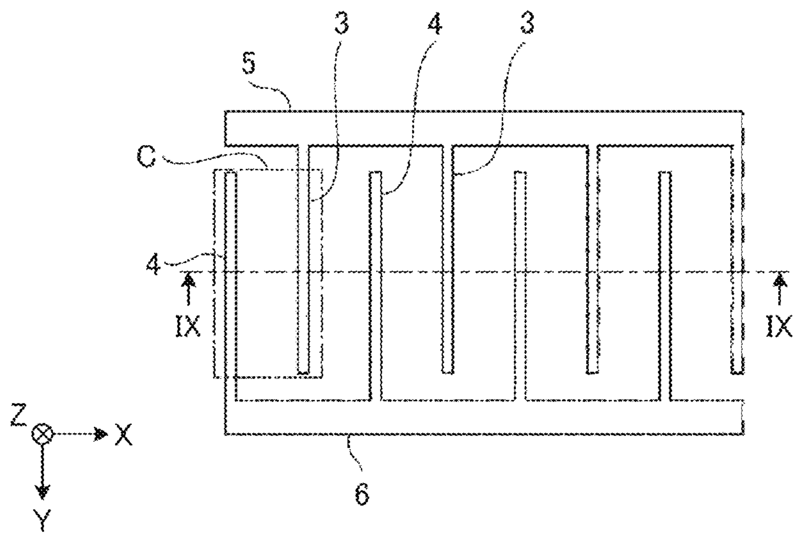
FIG. 1B is a plan view illustrating the structure of electrodes according to the first preferred embodiment of the present invention.

FIG. 1A is a perspective view illustrating an acoustic wave device according to a first preferred embodiment of the present invention. FIG. 1B is a plan view illustrating the structure of electrodes according to the first preferred embodiment.

An acoustic wave device 1 of the first preferred embodiment includes a piezoelectric layer 2 made of, for example, $LiNbO_3$. The piezoelectric layer 2 may be made of, for example, $LiTaO_3$. The cut angle of $LiNbO_3$ or $LiTaO_3$ is a Z-cut in the first preferred embodiment. The cut angle of $LiNbO_3$ or $LiTaO_3$ may be a rotated Y-cut or X-cut. The propagation orientation of Y propagation and X propagation of about ±30°, for example, are preferable.

The thickness of the piezoelectric layer 2 is not particularly limited but is preferably, for example, equal to or more than about 50 nm and equal to or less than about 1000 nm in order to effectively excite the first-order thickness-shear mode.

The piezoelectric layer 2 includes a first main surface 2*a* and a second main surface 2*b* facing each other in a Z direction. An electrode 3 and an electrode 4 are provided on the first main surface 2*a*.

Here, the electrode 3 is an example of a "first electrode finger", and the electrode 4 is an example of a "second electrode finger". In FIGS. 1A and 1B, a plurality of electrodes 3 are a plurality of "first electrode fingers" connected to a first busbar electrode 5. A plurality of electrodes 4 are a plurality of "second electrode fingers" connected to a second busbar electrode 6. The plurality of electrodes 3 and the plurality of electrodes 4 are interdigitated with each other. Thus, an interdigital transducer (IDT) electrode 30 including the plurality of electrodes 3, the plurality of electrodes 4, the first busbar electrode 5, and the second busbar electrode 6 is provided.

The electrode 3 and the electrode 4 have a rectangular or substantially rectangular shape and have a length direction. In a direction orthogonal or substantially orthogonal to the length direction, the electrode 3 and the electrode 4 adjacent to the electrode 3 face each other. The length direction of the electrode 3 and the electrode 4 and the direction orthogonal or substantially orthogonal to the length direction of the electrode 3 and the electrode 4 each are a direction intersecting a thickness direction of the piezoelectric layer 2. Therefore, it can also be said that the electrode 3 and the electrode 4 adjacent to the electrode 3 face each other in a direction intersecting the thickness direction of the piezoelectric layer 2. In the following description, the thickness direction of the piezoelectric layer 2 may be referred to as a Z direction (or a first direction), the length direction of the electrode 3 and the electrode 4 may be referred to as a Y direction (or a second direction), and the direction orthogonal to the length direction of the electrode 3 and the electrode 4 may be referred to as an X direction (or a third direction).

Further, the length direction of the electrode 3 and the electrode 4 may be replaced with the direction orthogonal or substantially orthogonal to the length direction of the electrode 3 and the electrode 4 illustrated in FIGS. 1A and 1B. That is, the electrode 3 and the electrode 4 may be extended in the direction in which the first busbar electrode 5 and the second busbar electrode 6 extend in FIGS. 1A and 1B. In this case, the first busbar electrode 5 and the second busbar electrode 6 extend in the direction in which the electrode 3 and the electrode 4 extend in FIGS. 1A and 1B. A plurality of pairs of structures in which the electrode 3 connected to one potential and the electrode 4 connected to the other potential are adjacent to each other is provided in a direction orthogonal or substantially orthogonal to the length direction of the above electrodes 3 and 4.

Here, the electrode 3 and the electrode 4 being adjacent to each other refers not to a case where the electrode 3 and the electrode 4 are arranged so as to be in direct contact with each other, but to a case where the electrode 3 and the electrode 4 are arranged with a space therebetween. In addition, when the electrode 3 and the electrode 4 are adjacent to each other, an electrode connected to a hot electrode or a ground electrode, including the other electrodes 3 and 4, is not arranged between the electrode 3 and the electrode 4. The number of pairs need not be integer pairs, but may be 1.5 pairs, 2.5 pairs, or the like.

The center-to-center distance between the electrode 3 and the electrode 4, that is, the pitch is preferably in the range of, for example, equal to or more than about 1 μm and equal to or less than about 10 μm. In addition, the center-to-center distance between the electrode 3 and the electrode 4 is a distance connecting the center of the width dimension of the electrode 3 in the direction orthogonal or substantially orthogonal to the length direction of the electrode 3 and the center of the width dimension of the electrode 4 in the direction orthogonal or substantially orthogonal to the length direction of the electrode 4.

Further, in a case where the number of at least one of the electrode 3 and the electrode 4 is one or more (when the electrode 3 and the electrode 4 define a pair of electrode set, there are 1.5 or more pairs of electrode sets), the center-to-center distance between the electrode 3 and the electrode 4 refers to the average value of the center-to-center distances between the respective adjacent electrodes 3 and 4 of the 1.5 or more pairs of electrodes 3 and 4.

In addition, the width of the electrodes 3 and 4, that is, the dimension of the electrodes 3 and 4 in their facing direction, is preferably in the range of, for example, equal to or more than about 150 nm and equal to or less than about 1000 nm. The center-to-center distance between the electrode 3 and the electrode 4 is a distance connecting the center of the dimension (width dimension) of the electrode 3 in the direction orthogonal to the length direction of the electrode 3 and the center of the dimension (width dimension) of the electrode 4 in the direction orthogonal to the length direction of the electrode 4.

In addition, in the first preferred embodiment, since the Z-cut piezoelectric layer is used, the direction orthogonal or substantially orthogonal to the length direction of the electrodes 3 and 4 is a direction orthogonal or substantially orthogonal to the polarization direction of the piezoelectric layer 2. The above case does not apply when a piezoelectric body of another cut angle is used as the piezoelectric layer 2. Here, "orthogonal" is not limited to strictly orthogonal but may be substantially orthogonal (an angle formed by a direction orthogonal to the length direction of the electrode 3 and the electrode 4 and the polarization direction is, for example, about 90°±10°).

Figure 2:
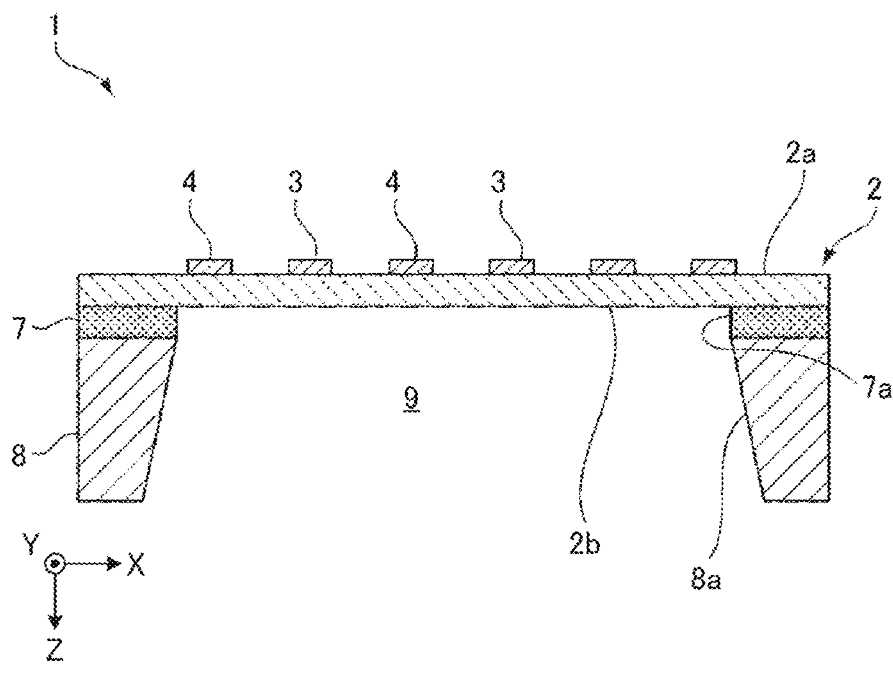
FIG. 2 is a cross-sectional view of a portion taken along line II-II of FIG. 1A.

A support substrate 8 is stacked on the second main surface 2*b* side of the piezoelectric layer 2 via a dielectric film 7. The dielectric film 7 and the support substrate 8 have a frame shape and include opening portions 7*a* and 8*a* as illustrated in FIG. 2. Thus, a cavity portion (air gap) 9 is provided.

The cavity portion 9 is provided so as not to interfere with the vibration of an excitation region C of the piezoelectric layer 2. Therefore, the support substrate 8 is stacked on the second main surface 2*b* via the dielectric film 7 at a position not overlapping a portion in which at least a pair of electrodes 3 and 4 are provided. The dielectric film 7 need not be provided. Therefore, the support substrate 8 can be directly or indirectly stacked on the second main surface 2*b* of the piezoelectric layer 2.

The dielectric film 7 is made of, for example, silicon oxide. However, the dielectric film 7 can be made of an appropriate insulating material such as, for example, silicon nitride or alumina in addition to silicon oxide.

The support substrate 8 is made of, for example, Si. The plane orientation of the surface of Si on the piezoelectric layer 2 side may be (100) or (110) and may be (111). Preferably, for example, high-resistance Si having a resistivity of equal to or more than about 4 kΩ is preferable. However, the support substrate 8 can also be made using an appropriate insulating material or semiconductor material. Examples of the material of the support substrate 8 include piezoelectric bodies such as aluminum oxide, lithium tantalate, lithium niobate, and quartz crystal; various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride, and the like.

The plurality of electrodes 3 and 4, the first busbar electrode 5, and the second busbar electrode 6 are made of an appropriate metal or alloy such as, for example, Al or an AlCu alloy. In the first preferred embodiment, the electrodes 3 and 4, the first busbar electrode 5, and the second busbar electrode 6 have a structure including, for example, an Al film stacked on a Ti film. A close contact layer other than the Ti film may be used.

At the time of driving, an AC voltage is applied between the plurality of electrodes 3 and the plurality of electrodes 4. More specifically, an AC voltage is applied between the first busbar electrode 5 and the second busbar electrode 6. As a result, it is possible to obtain a resonance characteristic using bulk waves in the first-order thickness-shear mode excited in the piezoelectric layer 2.

In addition, in the acoustic wave device 1, for example, d/p is equal to or less than about 0.5, where d is the thickness of the piezoelectric layer 2, and p is the center-to-center distance between any adjacent electrodes 3 and 4 of the plurality of pairs of electrodes 3 and 4. Therefore, the bulk waves in the above first-order thickness-shear mode are effectively excited, and good resonance characteristics can be obtained. More preferably, for example, d/p is equal to or less than about 0.24, in which case even better resonance characteristics can be obtained.

In a case where the number of at least one of the electrode 3 and the electrode 4 is one or more as in the first preferred embodiment, that is, when the electrode 3 and the electrode 4 define a pair of electrode set, in a case where there are 1.5 or more pairs of the electrode 3 and the electrode 4, the center-to-center distance p between the adjacent electrodes 3 and 4 is an average distance of the center-to-center distances between the respective adjacent electrodes 3 and 4.

Since the acoustic wave device 1 of the first preferred embodiment has the above-described configuration, even when the number of pairs of the electrode 3 and the electrode 4 is reduced in an attempt to achieve a reduction in size, Q value is not easily reduced. This is because the resonator does not require reflectors on both sides and has a small propagation loss. In addition, the reason why the above reflector is not required is that the bulk waves in the first-order thickness-shear mode are used.

Figure 3A:
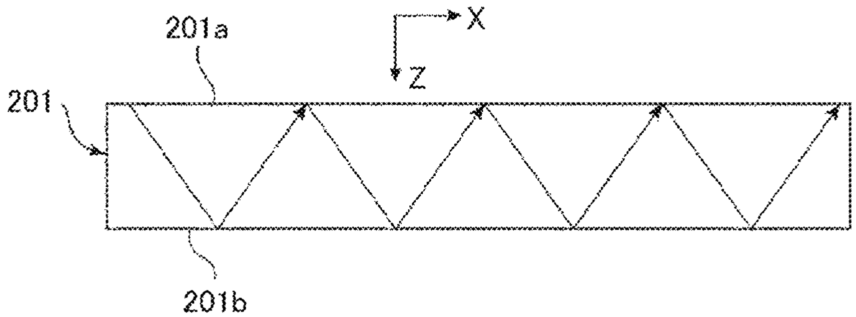
FIG. 3A is a schematic cross-sectional view for explaining Lamb waves propagating through a piezoelectric layer of a comparative example.
Figure 3B:
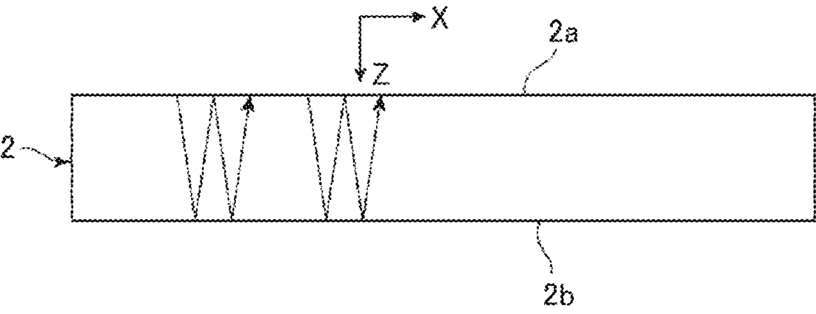
FIG. 3B is a schematic cross-sectional view for explaining bulk waves in a first-order thickness-shear mode propagating through a piezoelectric layer according to the first preferred embodiment of the present invention.
Figure 4:
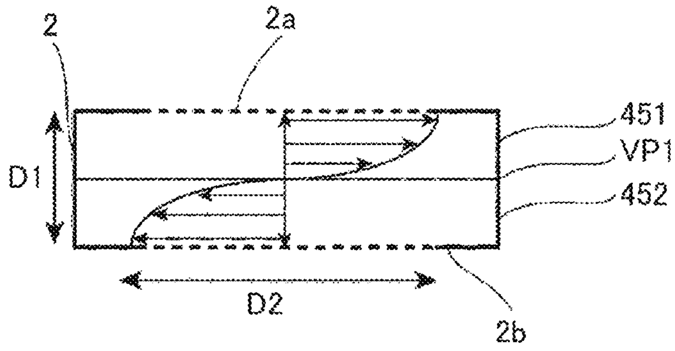
FIG. 4 is a schematic cross-sectional view for explaining an amplitude direction of bulk waves in the first-order thickness-shear mode propagating through the piezoelectric layer according to the first preferred embodiment of the present invention.

FIG. 3A is a schematic cross-sectional view for explaining Lamb waves propagating through a piezoelectric layer of a comparative example. FIG. 3B is a schematic cross-sectional view for explaining bulk waves in the first-order thickness-shear mode propagating through a piezoelectric layer of the first preferred embodiment. FIG. 4 is a schematic cross-sectional view for explaining an amplitude direction of the bulk waves in the first-order thickness-shear mode propagating through the piezoelectric layer of the first preferred embodiment.

In FIG. 3A, an acoustic wave device as described in Japanese Unexamined Patent Application Publication No. 2012-257019 is illustrated, and Lamb waves propagate through a piezoelectric layer. As illustrated in FIG. 3A, waves propagate through a piezoelectric layer 201 as indicated by arrows. Here, the piezoelectric layer 201 includes a first main surface 201*a* and a second main surface 201*b*, and the thickness direction connecting the first main surface 201*a* and the second main surface 201*b* is the Z direction. The X direction is a direction in which the electrodes 3 and 4 of the IDT electrode 30 are arranged. As illustrated in FIG. 3A, the Lamb waves propagate in the X direction as illustrated in FIG. 3A. Although the piezoelectric layer 201 vibrates as a whole because of plate waves, since the waves propagate in the X direction, the reflectors are arranged on both sides to obtain resonance characteristics. Therefore, a propagation loss of waves occurs, and the Q value decreases when the size is reduced, that is, when the number of pairs of electrodes 3 and 4 is reduced.

On the other hand, as illustrated in FIG. 3B, in the acoustic wave device of the first preferred embodiment, since the vibration displacement is in the thickness-shear direction, the wave substantially propagates in the direction connecting the first main surface 2*a* and the second main surface 2*b* of the piezoelectric layer 2, that is, the Z direction, and resonates. That is, the X direction component of the wave is significantly smaller than the Z direction component. Since the resonance characteristics are obtained by the propagation of the wave in the Z direction, a reflector is not required. Therefore, propagation loss is not generated when the wave propagates to the reflector. Therefore, even when the number of pairs of electrodes of the electrode 3 and the electrode 4 is reduced to reduce the size, the Q value is not easily reduced.

As illustrated in FIG. 4, the amplitude directions of the bulk waves in the first-order thickness-shear mode are opposite in a first region 451 included in the excitation region C (see FIG. 1B) of the piezoelectric layer 2 and a second region 452 included in the excitation region C. FIG. 4 schematically illustrates the bulk waves when a voltage is applied between the electrode 3 and the electrode 4 so that the electrode 4 has a higher potential than the electrode 3. The first region 451 is a region between the first main surface 2*a* and a virtual plane VP1 that is orthogonal or substantially orthogonal to the thickness direction of the piezoelectric layer 2 and divides the piezoelectric layer 2 into two parts in the excitation region C. The second region 452 is a region between the virtual plane VP1 and the second main surface 2*b* in the excitation region C.

In the acoustic wave device 1, at least a pair of electrodes including the electrode 3 and the electrode 4 are arranged, however, since waves are not propagated in the X direction, the plurality of pairs of electrodes including the electrode 3 and the electrode 4 is not always necessary. That is, only at least a pair of electrodes may be provided.

For example, the electrode 3 is an electrode connected to a hot potential, and the electrode 4 is an electrode connected to a ground potential. However, the electrode 3 may be connected to the ground potential and the electrode 4 may be connected to the hot potential. In the first preferred embodiment, as described above, at least a pair of electrodes include an electrode connected to the hot potential or an electrode connected to the ground potential, and a floating electrode is not provided.

Figure 5:
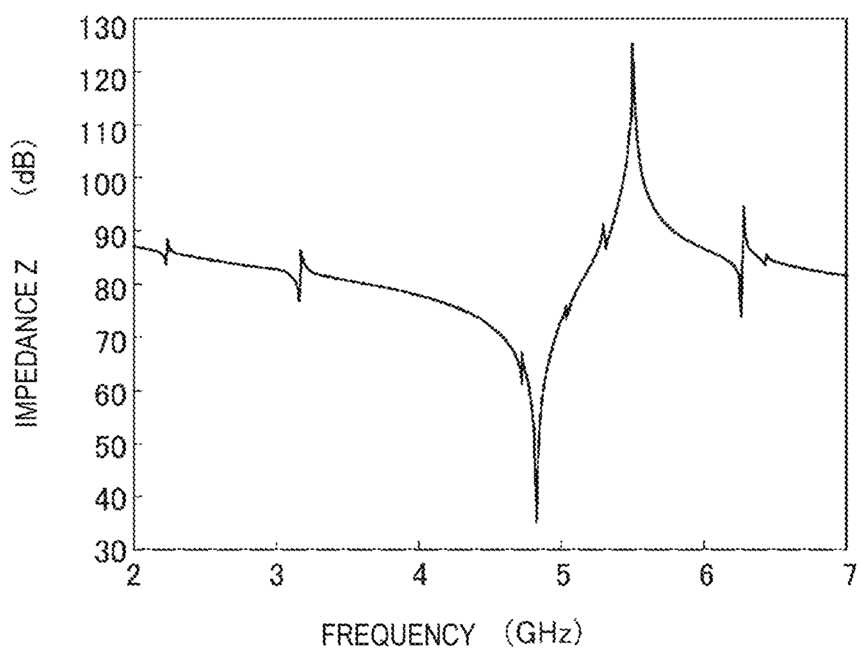
FIG. 5 is an explanatory diagram illustrating an example of resonance characteristics of the acoustic wave device according to the first preferred embodiment of the present invention.

FIG. 5 is an explanatory diagram illustrating an example of resonance characteristics of the acoustic wave device of the first preferred embodiment. The design parameters of the acoustic wave device 1 having the resonance characteristics illustrated in FIG. 5 are as follows.

Piezoelectric layer 2: $LiNbO_3$ with Euler angles (0°, 0°, 90°)

Thickness of piezoelectric layer 2: about 400 nm

Length of excitation region C (see FIG. 1B): about 40 μm

1 Number of pairs of electrodes consisting of electrode 3 and electrode 4: 21 pairs Center-to-center distance (pitch) between electrode 3 and electrode 4: about 3 μm Width of electrodes 3 and 4: about 500 nm d/p: about 0.133

Dielectric film 7: silicon oxide film with thickness of about 1 μm

Support substrate 8: Si

The excitation region C (see FIG. 1B) is a region in which the electrode 3 and the electrode 4 overlap when viewed in the X direction orthogonal or substantially orthogonal to the length direction of the electrodes 3 and 4. The length of the excitation region C is a dimension of the excitation region C along the length direction of the electrodes 3 and 4.

In the first preferred embodiment, the inter-electrode distances of the electrode pairs consisting of the electrodes 3 and the electrodes 4 were all equal or substantially equal in the plurality of pairs. That is, the electrodes 3 and the electrodes 4 were arranged with equal or substantially equal pitches.

As is apparent from FIG. 5, good resonance characteristics with the fractional bandwidth of about 12.5% are obtained even though no reflector is provided.

In the first preferred embodiment, for example, d/p is equal to or less than about 0.5, more preferably equal to or less than about 0.24, where d is the thickness of the above piezoelectric layer 2 and p is the center-to-center distance between the electrode 3 and the electrode 4. The above relationship will be described with reference to FIG. 6.

Figure 6:
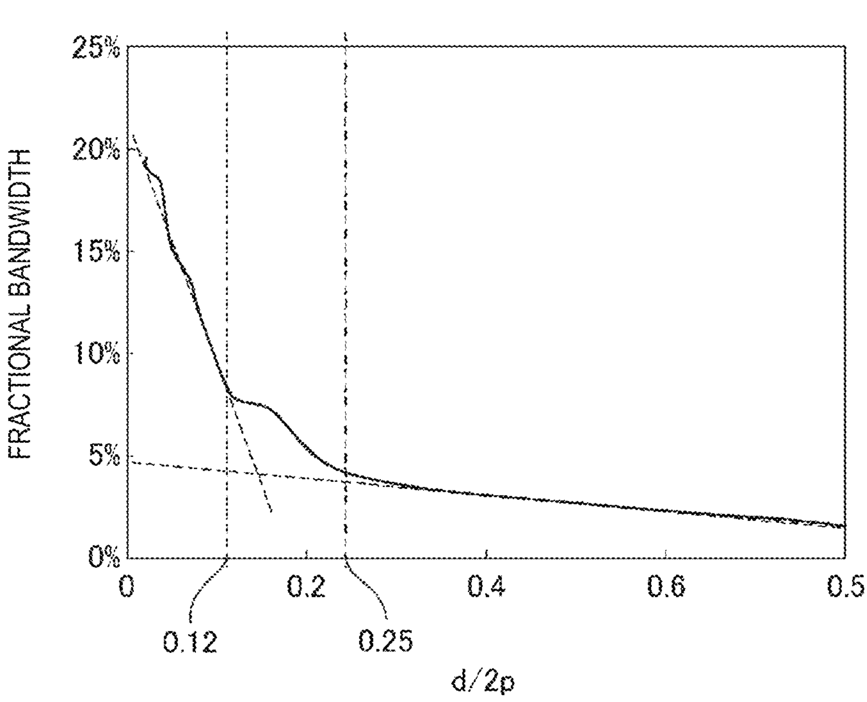
FIG. 6 is an explanatory diagram illustrating the relationship between d/2p and a fractional bandwidth as a resonator in the acoustic wave device according to the first preferred embodiment of the present invention, where p is a center-to-center distance or an average distance of the center-to-center distances between adjacent electrodes, and d is an average thickness of the piezoelectric layer.

A plurality of acoustic wave devices was obtained in the same or substantially the same manner as the acoustic wave device having the resonance characteristics illustrated in FIG. 5, except that d/2p was changed. FIG. 6 is an explanatory diagram illustrating the relationship between d/2p and the fractional bandwidth as the resonator in the acoustic wave device of the first preferred embodiment, where p is the center-to-center distance or the average distance of the center-to-center distances between adjacent electrodes, and d is the average thickness of the piezoelectric layer 2.

As illustrated in FIG. 6, when d/2p exceeds about 0.25, that is, d/p>about 0.5, the fractional bandwidth is less than about 5% even when d/p is adjusted. On the other hand, when d/2p about 0.25, that is, d/p≤about 0.5, the fractional bandwidth can be equal to or more than about 5% by changing d/p within the range, that is, the resonator having a high coupling coefficient can be provided. In addition, when d/2p is equal to or less than about 0.12, that is, d/p is equal to or less than about 0.24, the fractional bandwidth can be increased to equal to or more than about 7%. In addition, when d/p is adjusted within the range, a resonator having a wider fractional bandwidth can be obtained, and a resonator having a higher coupling coefficient can be obtained. Therefore, it is understood that by setting d/p to equal to or less than about 0.5 as the first preferred embodiment, a resonator having a high coupling coefficient using the bulk waves in the above first-order thickness-shear mode can be formed.

At least a pair of electrodes may be one pair of electrodes, and in the case of one pair of electrodes, p is the center-to-center distance between the adjacent electrodes 3 and 4. Further, in the case of 1.5 or more pairs of electrodes, the average distance of the center-to-center distances between the adjacent electrodes 3 and 4 may be defined as p.

In addition, also for a thickness d of the piezoelectric layer 2, a value obtained by averaging the thicknesses may be employed when the piezoelectric layer 2 has variations in thickness.

Figure 7:
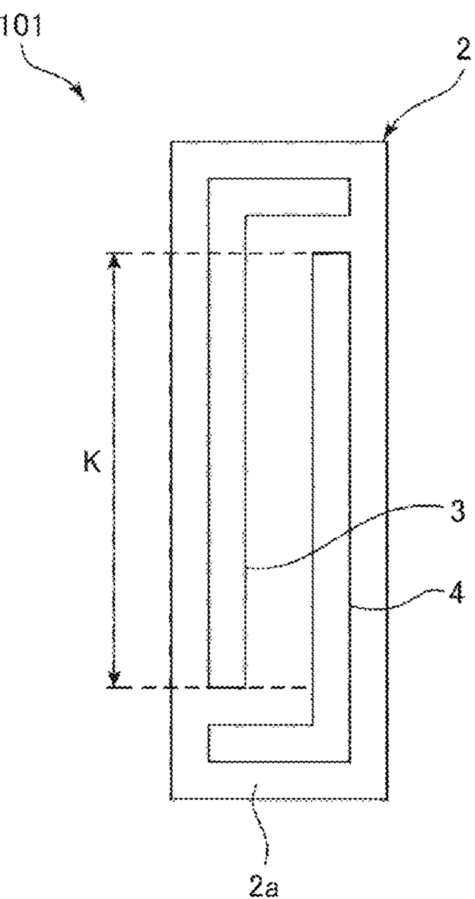
FIG. 7 is a plan view illustrating an example in which a pair of electrodes are provided in the acoustic wave device according to the first preferred embodiment of the present invention.

FIG. 7 is a plan view illustrating an example in which a pair of electrodes are provided in the acoustic wave device of the first preferred embodiment. In the acoustic wave device 101, a pair of electrodes including the electrode 3 and the electrode 4 are provided on the first main surface 2*a* of the piezoelectric layer 2. Note that K in FIG. 7 is an intersecting width. As described above, in acoustic wave devices according to preferred embodiments of the present invention, the number of pairs of electrodes may be one. Also in this case, when the above d/p is equal to or less than about 0.5, the bulk waves in the first-order thickness-shear mode can be effectively excited.

In the acoustic wave device 1, preferably, when viewed in a direction in which any adjacent electrodes 3 and 4 of the plurality of electrodes 3 and 4 face each other, for the metallization ratio MR of the above adjacent electrodes 3 and 4 with respect to the excitation region C, which is a region where the adjacent electrodes 3 and 4 overlap each other, for example, MR≤about 1.75 (d/p)+0.075 is preferably satisfied. In this case, the spurious mode can be effectively reduced. The mode will be described with reference to FIG. 8 and FIG. 9.

Figure 8:
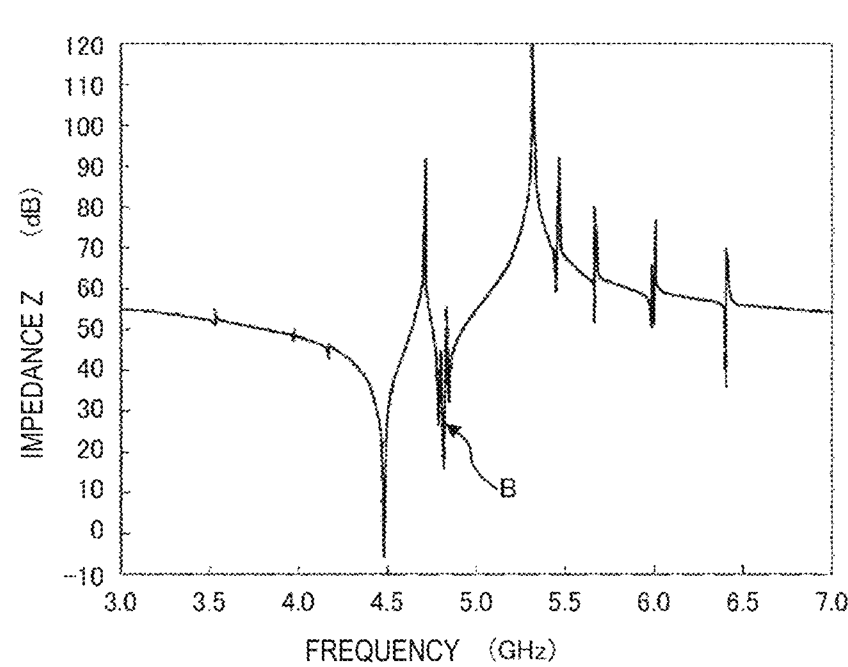
FIG. 8 is a reference diagram illustrating an example of resonance characteristics of the acoustic wave device according to the first preferred embodiment of the present invention.

FIG. 8 is a reference diagram illustrating an example of resonance characteristics of the acoustic wave device of the first preferred embodiment. A spurious mode indicated by an arrow B appears between the resonant frequency and the antiresonant frequency. Note that d/p=about 0.08 and Euler angles (0°, 0°, 90°) of $LiNbO_3$ were set. In addition, the above metallization ratio was set as MR=about 0.35.

The metallization ratio MR is explained with reference to FIG. 1B. When attention is paid to the pair of electrodes 3 and 4 in the structure of the electrodes illustrated in FIG. 1B, only the pair of electrodes 3 and 4 are provided. In this case, a portion surrounded by an alternate long and short dash line is the excitation region C. The excitation region C is a region where the electrode 3 overlaps the electrode 4, a region where the electrode 4 overlaps the electrode 3, and a region where the electrode 3 and the electrode 4 overlap each other in a region between the electrode 3 and the electrode 4 when the electrode 3 and the electrode 4 are viewed in a direction orthogonal or substantially orthogonal to the length direction of the electrode 3 and the electrode 4, that is, in the facing direction. The area of the electrodes 3 and 4 in the excitation region C with respect to the area of the excitation region C is the metallization ratio MR. That is, the metallization ratio MR is the ratio of the area of the metallization portion to the area of the excitation region C.

When a plurality of pairs of electrodes 3 and 4 is provided, the rate of the metallization portion included in the entire excitation region C with respect to the total area of the excitation region C may be defined as MR.

Figure 9:
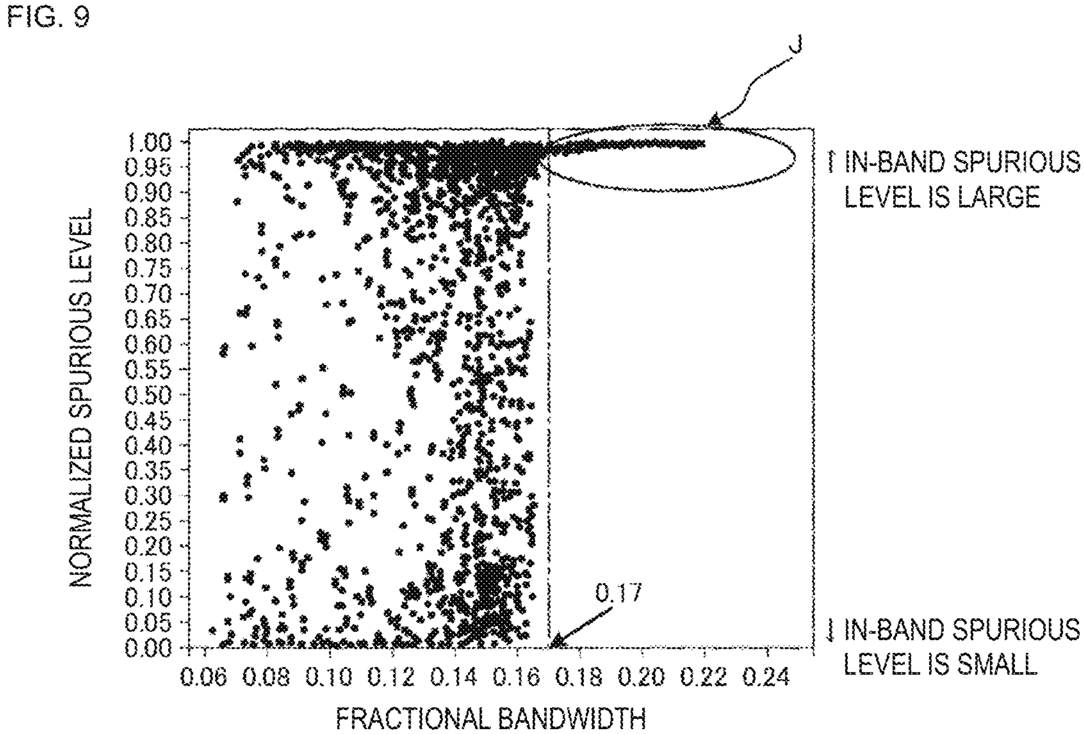
FIG. 9 is an explanatory diagram illustrating the relationship between the fractional bandwidth and the phase rotation amount of the spurious impedance normalized by 180 degrees as the magnitude of the spurious emission when a large number of acoustic wave resonators are included in the acoustic wave device according to the first preferred embodiment of the present invention.

FIG. 9 is an explanatory diagram illustrating the relationship between the fractional bandwidth and the phase rotation amount of the spurious impedance normalized by 180 degrees as the magnitude of the spurious emission when a large number of acoustic wave resonators are included in the acoustic wave device of the first preferred embodiment. The fractional bandwidth was adjusted by variously changing the film thickness of the piezoelectric layer 2 and the dimensions of the electrodes 3 and 4. In addition, although FIG. 9 shows the results obtained when the piezoelectric layer 2 made of the Z-cut $LiNbO_3$ is used, the same or substantially the same tendency is obtained when the piezoelectric layer 2 having another cut angle is used.

In a region surrounded by an ellipse J in FIG. 9, the spurious level is as large as about 1.0. As is clear from FIG. 9, when the fractional bandwidth exceeds about 0.17, that is, when the fractional bandwidth exceeds about 17%, a large spurious emission having the spurious level of 1 or more appears in the pass band even when the parameters constituting the fractional bandwidth are changed. That is, as in the resonance characteristics illustrated in FIG. 8, a large spurious emission indicated by an arrow B appears in the band. Therefore, the fractional bandwidth is preferably equal to or less than about 17%. In this case, the spurious emission can be reduced by adjusting the film thickness of the piezoelectric layer 2 and the dimensions of the electrodes 3 and 4.

Figure 10:
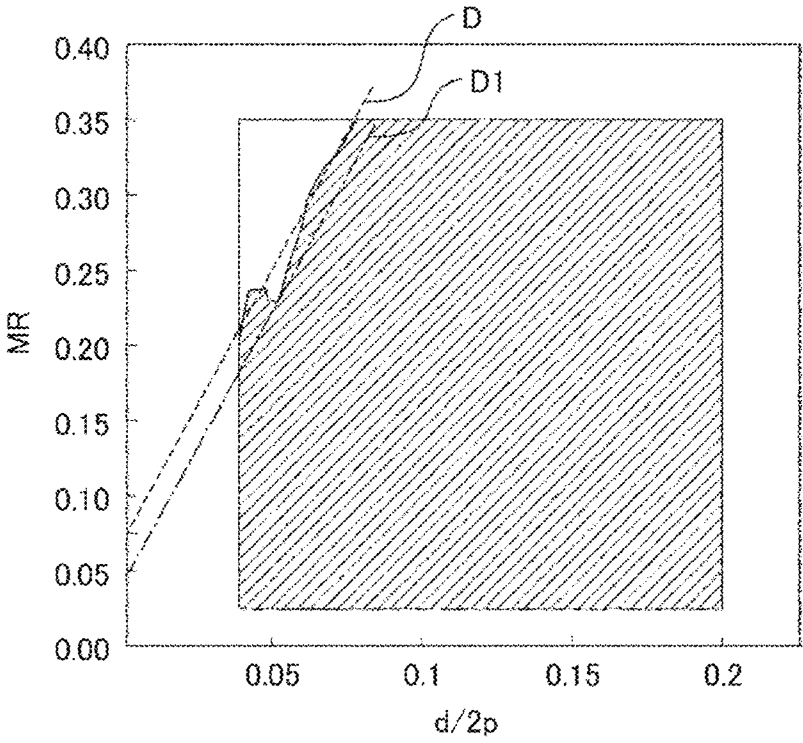
FIG. 10 is an explanatory diagram illustrating the relationship between d/2p, a metallization ratio MR, and a fractional bandwidth.

FIG. 10 is an explanatory diagram illustrating the relationship between d/2p, the metallization ratio MR, and the fractional bandwidth. In the acoustic wave device 1 of the first preferred embodiment, various acoustic wave devices 1 having different values of d/2p and different values of MR were formed, and the fractional bandwidth was measured. A hatched portion to the right side of a broken line D illustrated in FIG. 10 is a region where the fractional bandwidth is equal to or less than about 17%. The boundary between the hatched region and the non-hatched region is represented by MR=about 3.5 (d/2p)+0.075. That is, MR=about 1.75 (d/p)+0.075. Therefore, MR≤about 1.75 (d/p)+0.075 is preferably satisfied. In this case, the fractional bandwidth is easily set to be equal to or less than about 17%. More preferably, it is the region in FIG. 10 to the right of an alternate long and short dash line D1 indicating MR=about 3.5 (d/2p)+0.05. That is, when MR≤about 1.75 (d/p)+0.05, the fractional bandwidth can be reliably set to equal to or less than about 17%.

Figure 11:
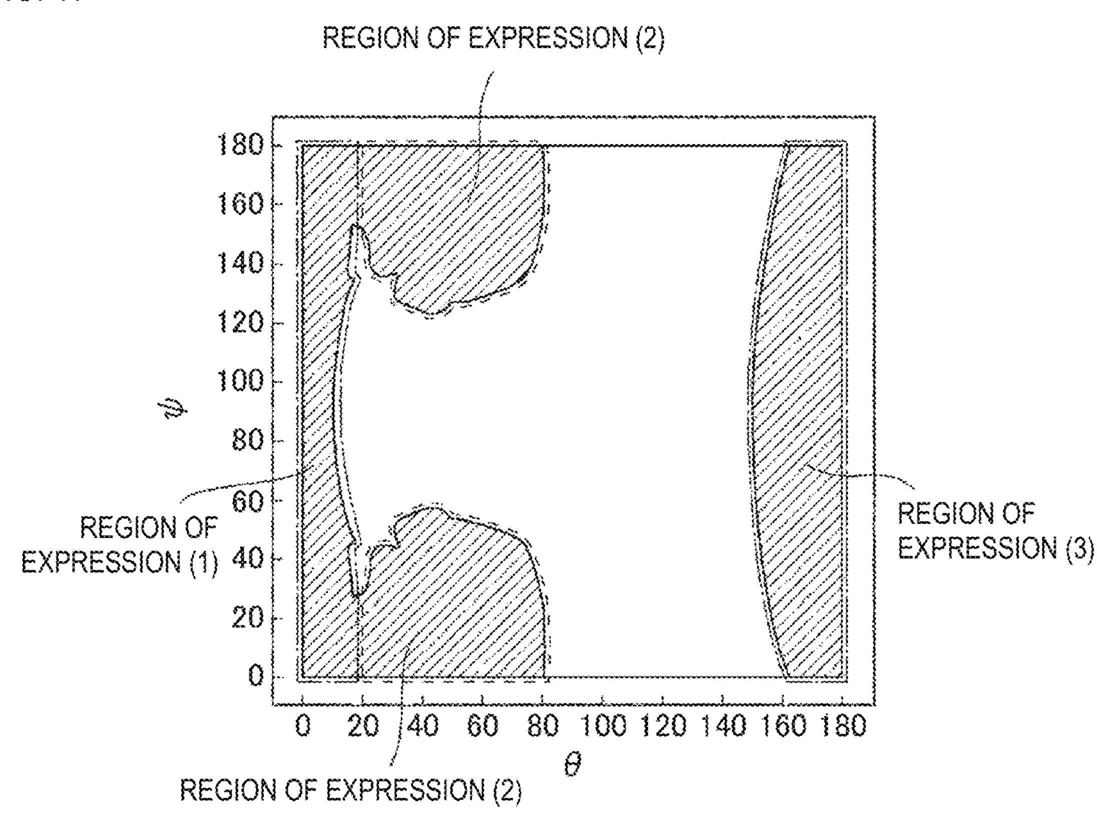
FIG. 11 is an explanatory diagram illustrating a map of the fractional bandwidth with respect to the Euler angles (0°, θ, ψ) of $LiNbO_3$ when d/p is made as close to 0 as possible.

FIG. 11 is an explanatory diagram illustrating a map of the fractional bandwidth with respect to the Euler angles (0°, θ, ψ) of $LiNbO_3$ when d/p is made as close to 0 as possible. A hatched portion illustrated in FIG. 11 is a region where the fractional bandwidth of at least equal to or more than about 5% is obtained. When the range of the region is approximated, the range is expressed by the following Expression (1), Expression (2), and Expression (3).

(0°±10°,0° to 20°,arbitrary ψ) Expression (1)

(0°±10°,20° to 80°,0° to 60°$(1-(\theta-50)^2/900)^{1/2}$) or (0°±10°,20° to 80°,[180°−60°$(1-(0-50)^2/900)^{1/2}$] to 180°) Expression (2)

(0°±10°,[180°−30° $(1-(\psi-90)^2/8100)^{1/2}$] to 180°, arbitrary ψ) Expression (3)

Therefore, in the case of the Euler angle range of the above Expression (1), Expression (2) or Expression (3), the fractional bandwidth can be sufficiently widened, which is preferable.

FIG. 12 is a partially cutaway perspective view for explaining an acoustic wave device according to a preferred embodiment of the present invention. In FIG. 12, the outer peripheral edge of the cavity portion 9 is indicated by a broken line. The acoustic wave device of the present preferred embodiment may use plate waves. In this case, as illustrated in FIG. 12, an acoustic wave device 301 includes reflectors 310 and 311. The reflectors 310 and 311 are provided on both sides of the electrodes 3 and 4 of the piezoelectric layer 2 in the acoustic wave propagation direction. In the acoustic wave device 301, Lamb waves as plate waves are excited by applying an alternating electric field to the electrodes 3 and 4 above the cavity portion 9. Since the reflectors 310 and 311 are provided on both sides, resonance characteristics due to the Lamb waves as the plate waves can be obtained.

As described above, in the acoustic wave devices 1 and 101, the bulk waves in the first-order thickness-shear mode are used. In addition, in the acoustic wave devices 1 and 101, the electrode 3 and the electrode 4 are adjacent to each other, and d/p is, for example, equal to or less than about 0.5, where d is the thickness of the piezoelectric layer 2 and p is the center-to-center distance between the electrode 3 and the electrode 4. As a result, even when the acoustic wave device is reduced in size, the Q value can be increased.

In the acoustic wave devices 1 and 101, the piezoelectric layer 2 is made of, for example, lithium niobate or lithium tantalate. On the first main surface 2*a* or the second main surface 2*b* of the piezoelectric layer 2, there are electrodes 3 and 4 facing each other in a direction intersecting the thickness direction of the piezoelectric layer 2, and the electrodes 3 and 4 are desirably covered with a protective film.

Figure 13:
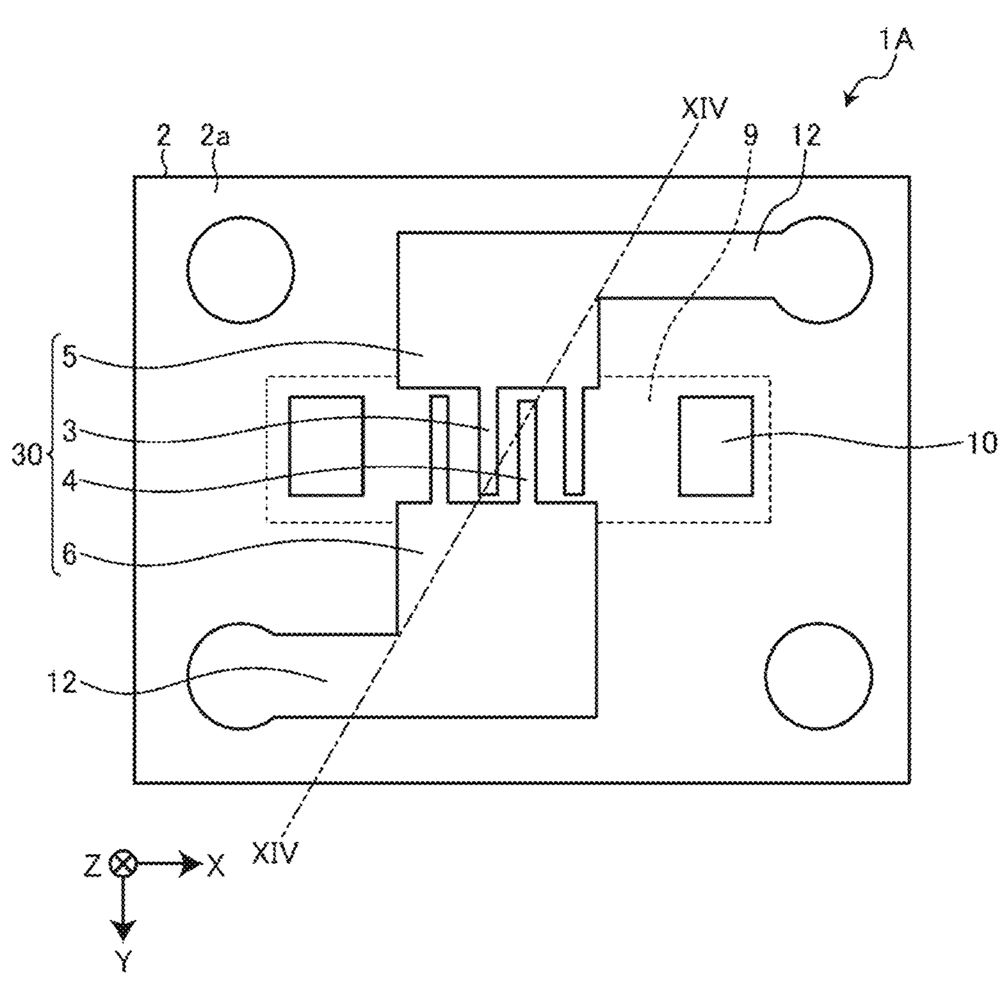
FIG. 13 is a plan view of an example of the acoustic wave device according to the first preferred embodiment of the present invention.
Figure 14:
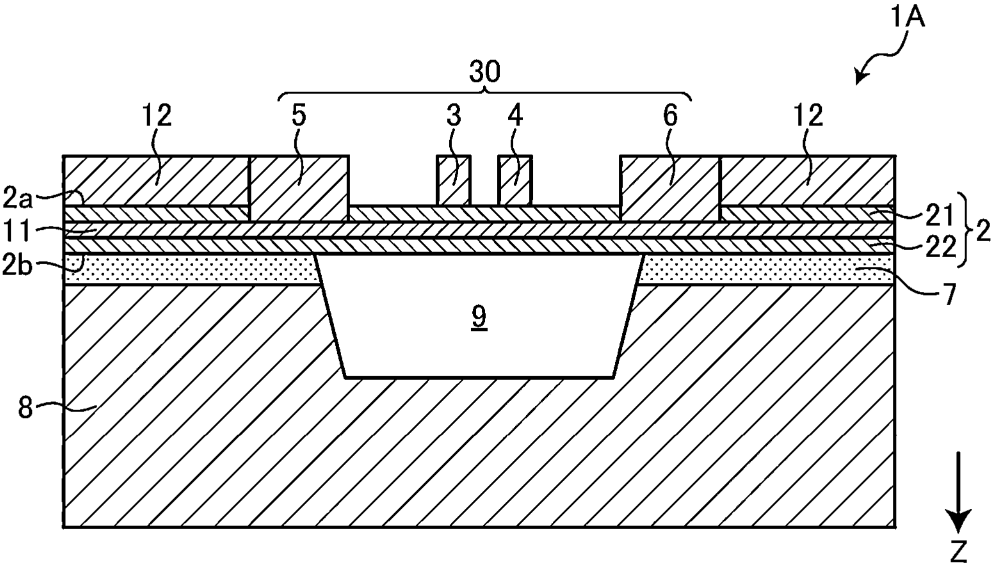
FIG. 14 is a diagram illustrating an example of a cross section of a portion taken along line XIV-XIV of FIG. 13.

FIG. 13 is a plan view of an example of the acoustic wave device according to the first preferred embodiment. FIG. 14 is a diagram illustrating an example of the cross section of a portion taken along line XIV-XIV of FIG. 13. As illustrated in FIG. 14, an acoustic wave device 1A according to the first preferred embodiment further includes a high thermal conductive film 11. In addition, as illustrated in FIG. 13, a wiring electrode 12 is connected to the IDT electrode 30, and a through-hole 10 is provided in the piezoelectric layer 2.

In the first preferred embodiment, the piezoelectric layer 2 includes a first piezoelectric body 21 and a second piezoelectric body 22. In this case, the thickness d of the piezoelectric layer 2 indicates a distance between the first main surface 2*a* and the second main surface 2*b* in the Z direction. The first piezoelectric body 21 is a piezoelectric body having the first main surface 2*a*. The second piezoelectric body 22 is a piezoelectric body including the second main surface 2*b* and is stacked on the first piezoelectric body 21 in the Z direction. The first piezoelectric body 21 and the second piezoelectric body 22 are made of the same material.

The high thermal conductive film 11 is a heat dissipation layer provided in the piezoelectric layer 2 in the Z direction. In the first preferred embodiment, the high thermal conductive film 11 is provided so as to be interposed in the piezoelectric layer 2 in the Z direction. In the example of FIG. 14, the high thermal conductive film 11 is provided between the first piezoelectric body 21 and the second piezoelectric body 22 of the piezoelectric layer 2. It is preferable that the high thermal conductive film 11 has higher thermal conductivity than the piezoelectric layer 2 and can be used as a bonding layer between the first piezoelectric body 21 and the second piezoelectric body 22 in manufacturing the acoustic wave device 1A to be described later. The high thermal conductive film 11 can be made of, for example, alumina, silicon nitride, aluminum nitride, or silicon oxide.

The wiring electrode 12 is an electrode provided on the first main surface 2*a*. In the first preferred embodiment, a plurality of wiring electrodes 12 are provided and electrically connected to the busbar electrodes 5 and 6 of the IDT electrode 30, respectively. Similar to the IDT electrode 30, the wiring electrode 12 may be made of an appropriate metal or alloy.

In the first preferred embodiment, the IDT electrode 30 is connected to the high thermal conductive film 11. In the example of FIG. 14, the busbar electrodes 5 and 6 of the IDT electrode 30 penetrate the first piezoelectric body 21 in the Z direction and are in direct contact with the high thermal conductive film 11. With this structure, heat generated by excitation of the IDT electrode 30 can be dissipated to the high thermal conductive film 11.

The through-hole 10 is a hole penetrating the piezoelectric layer 2 in the Z direction. The through-hole 10 is provided at a position overlapping the cavity portion 9 in a plan view in the Z direction and communicates with the cavity portion 9 in the Z direction. With this configuration, the cavity portion 9 can be easily formed during manufacturing the acoustic wave device 1A to be described later. In FIG. 13, the through-hole 10 has a rectangular or substantially rectangular shape in a plan view in the Z direction, and two through-holes 10 are provided at both ends of the cavity portion 9 in the X direction, but the configuration is merely an example, and the through-hole 10 can have any suitable shape, and the number of through-holes 10 is not limited to the above.

A non-limiting example of a manufacturing method of the acoustic wave device 1A according to the first preferred embodiment will be described below. The manufacturing method of the acoustic wave device 1A is not limited to the following manufacturing method.

First, the cavity portion 9 is formed in the plate-shaped support substrate 8 by resist patterning, dry etching, and resist removal, for example. Next, a sacrificial layer is formed in the cavity portion 9 of the support substrate 8, and the sacrificial layer is embedded by, for example, surface polishing. Then, the dielectric film 7 is formed as a bonding layer on the sacrificial layer side of the support substrate 8, which is bonded to a second piezoelectric substrate with the dielectric film 7 formed thereon in the same or substantially the same manner. After the bonding, the second piezoelectric substrate is thinned by, for example, grinding to form the second piezoelectric body 22. Similarly, the high thermal conductive film 11 is formed as a bonding layer on the second piezoelectric body 22, which is bonded to a first piezoelectric substrate with the high thermal conductive film 11 formed thereon. The bonded first piezoelectric substrate is thinned by, for example, grinding to form the first piezoelectric body 21.

In the example of FIG. 14, resist patterning and dry etching are further performed on the first main surface 2*a* of the piezoelectric layer 2 to provide an opening in a portion of the first piezoelectric body 21. The IDT electrode 30 and the wiring electrode 12 are formed on the first main surface 2*a* by, for example, lift-off.

After the electrodes are formed, the first main surface 2*a* is protected by resist patterning, and then the first piezoelectric body 21, the high thermal conductive film 11, the second piezoelectric body 22, and the dielectric film 7 are etched to form the through-hole 10. In this state, the resist is once removed to perform surface protection again by resist patterning, and the sacrificial layer and a portion of the dielectric film 7 are removed to form the cavity portion 9. Thereafter, by removing the resist, the acoustic wave device 1A according to the first preferred embodiment is manufactured.

Although the acoustic wave device 1A according to the first preferred embodiment has been described above, the configuration of the acoustic wave device is not limited to the example illustrated in FIG. 14.

For example, the high thermal conductive film 11 is not limited to a layer provided between the first piezoelectric body 21 and the second piezoelectric body 22 in the Z direction and may be a layer included in the piezoelectric layer 2. That is, in the example of FIG. 14, the high thermal conductive film 11 is exposed in the X direction and the Y direction but may be present in the piezoelectric layer 2 in any direction.

In addition, the IDT electrode 30 is not limited to being in direct contact with the high thermal conductive film 11 and may be connected to the high thermal conductive film 11 via another metal member, such as, for example, the wiring electrode 12. Hereinafter, modifications of the connection mode between the IDT electrode 30 and the high thermal conductive film 11 will be described with reference to the drawings. In the following description, the same or corresponding components as those of the example illustrated in FIG. 13 and FIG. 14 are denoted by the same reference numerals, and description thereof is omitted.

Figure 15:
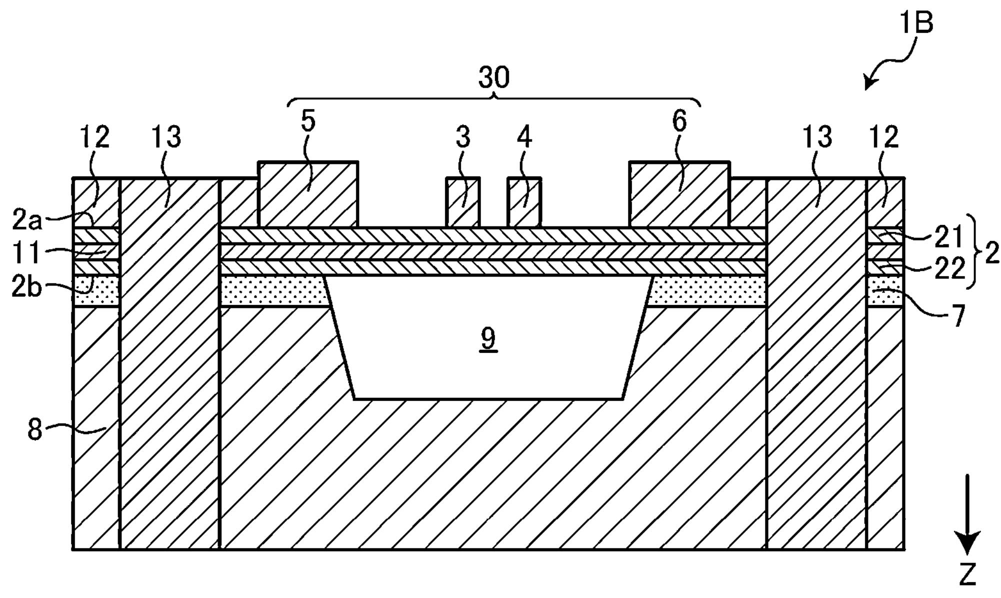
FIG. 15 is a diagram illustrating a first modification of the cross section of a portion taken along line XIV-XIV of FIG. 13.

FIG. 15 is a diagram illustrating a first modification of the cross section of a portion taken along line XIV-XIV of FIG. 13. As illustrated in FIG. 15, the IDT electrode 30 may be connected to the high thermal conductive film 11 via a through electrode 13. The through electrode 13 is an electrode including one end in the Z direction connected to the IDT electrode 30 or the wiring electrode 12. In an acoustic wave device 1B according to the first modification, the through electrode 13 is provided at a position overlapping the wiring electrode 12 in a plan view in the Z direction, and is provided so as to penetrate the wiring electrode 12, the piezoelectric layer 2, the high thermal conductive film 11, the dielectric film 7, and the support substrate 8 in the Z direction. With this structure, heat generated by excitation of the IDT electrode 30 can be dissipated to the high thermal conductive film 11 via the through electrode 13. Similar to the IDT electrode 30, the through electrode 13 may be made of an appropriate metal or alloy.

Figure 16:
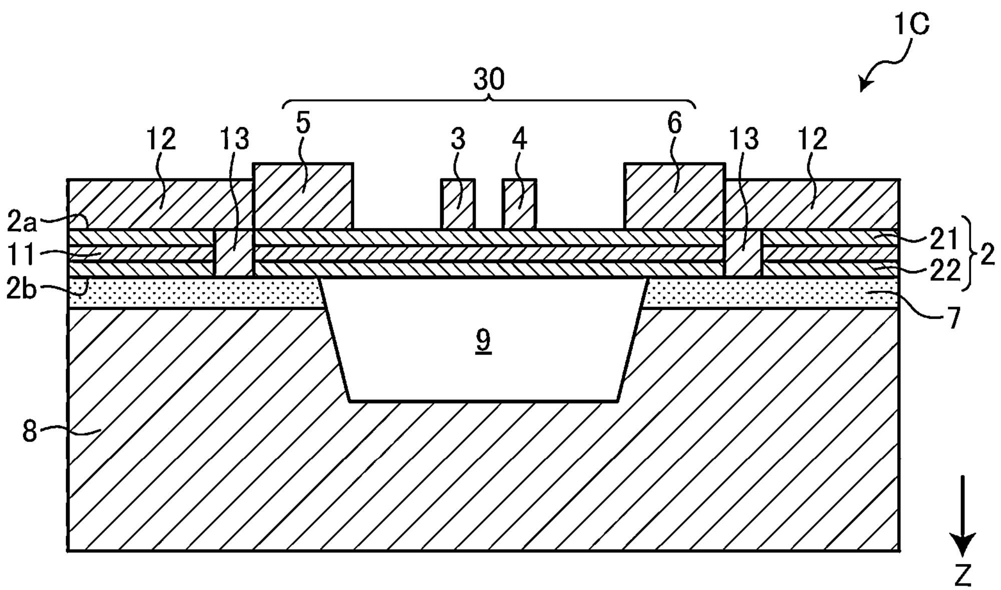
FIG. 16 is a diagram illustrating a second modification of the cross section of a portion taken along line XIV-XIV of FIG. 13.

FIG. 16 is a diagram illustrating a second modification of the cross section of a portion taken along line XIV-XIV of FIG. 13. As illustrated in FIG. 16, the through electrode 13 only needs to be in contact with the IDT electrode 30 or the wiring electrode 12 and the high thermal conductive film 11 and may penetrate only the piezoelectric layer 2. Also, in an acoustic wave device 1C according to the second modification, heat generated by excitation of the IDT electrode 30 can be dissipated to the high thermal conductive film 11 via the through electrode 13.

Figure 17:
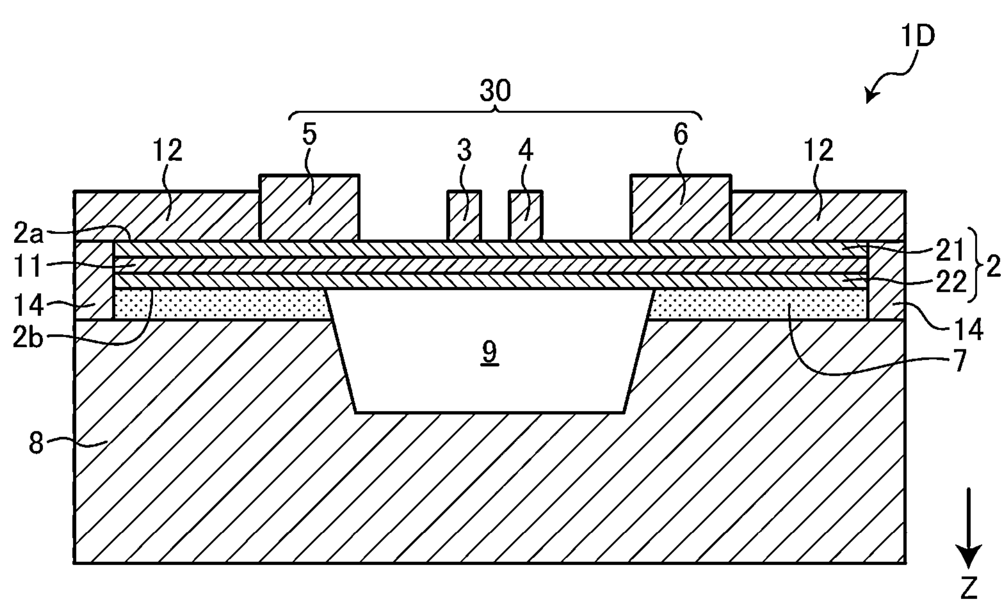
FIG. 17 is a diagram illustrating a third modification of the cross section of a portion taken along line XIV-XIV of FIG. 13.

FIG. 17 is a diagram illustrating a third modification of the cross section of a portion taken along line XIV-XIV of FIG. 13. The IDT electrode 30 may be connected to the high thermal conductive film 11 via a metal member that does not penetrate the piezoelectric layer 2. In an acoustic wave device 1D according to the third modification, the metal member that does not penetrate the piezoelectric layer 2 is, for example, a side electrode 14. The side electrode 14 is an electrode provided on a surface parallel or substantially parallel to the Z direction of the piezoelectric layer 2 and the dielectric film 7. As illustrated in FIG. 17, the side electrode 14 is connected to the wiring electrode 12 at one end in the Z direction. With this structure, heat generated by excitation of the IDT electrode 30 can be dissipated to the high thermal conductive film 11 via the side electrode 14. Similar to the IDT electrode 30, the side electrode 14 may be made of an appropriate metal or alloy.

As described above, the acoustic wave devices 1A to 1D according to the first preferred embodiment include the support substrate 8, the piezoelectric layer 2 including, for example, lithium niobate or lithium tantalate provided in the first direction, which is the thickness direction of the support substrate 8, and including the first main surface 2*a* in the first direction, the cavity portion 9 provided between the support substrate 8 and the piezoelectric layer 2, the IDT electrode 30 provided on the first main surface 2*a* of the piezoelectric layer 2 and including the first busbar electrode 5 and the second busbar electrode 6 that face each other, the plurality of electrodes 3 each including the base end connected to the first busbar electrode 5, and the plurality of electrodes 4 each including the base end connected to the second busbar electrode 6, the wiring electrode 12 provided on the first main surface 2*a* of the piezoelectric layer 2 and connected to the IDT electrode 30, and the high thermal conductive film 11 provided in the piezoelectric layer 2 in the first direction and having the thermal conductivity higher than the thermal conductivity of the piezoelectric layer 2, in which at least a portion of the IDT electrode 30 is provided in a region overlapping the cavity portion 9 in a plan view in the first direction, the high thermal conductive film 11 is provided in a region overlapping the cavity portion 9 in a plan view in the first direction, and the IDT electrode 30 is connected to the high thermal conductive film 11 directly or via a metal.

With this configuration, heat generated by excitation of the IDT electrode 30 can be released to the high thermal conductive film 11, and thus accumulation of heat can be reduced or prevented.

The high thermal conductive film 11 preferably includes, for example, at least one of alumina, silicon nitride, and aluminum nitride. Accordingly, the thermal conductivity of the high thermal conductive film 11 can be increased, and the accumulation of heat can be further reduced or prevented.

The high thermal conductive film 11 preferably includes, for example, silicon oxide. As such, the thermal conductivity of the high thermal conductive film 11 can be increased, and the accumulation of heat can be further reduced or prevented.

In addition, the high thermal conductive film 11 may also be provided in a region that does not overlap the cavity portion 9 in a plan view in the first direction. Also in this case, accumulation of heat can be reduced or prevented.

In addition, the through electrode 13 penetrating the piezoelectric layer 2 may be further provided, and the through electrode 13 may be in contact with at least one of the IDT electrode 30 and the wiring electrode 12 and the high thermal conductive film 11. As a result, since the IDT electrode 30 can release heat to the high thermal conductive film 11 via the through electrode 13, accumulation of heat can be reduced or prevented.

In a preferred embodiment, the through electrode 13 penetrates the high thermal conductive film 11. With the configuration, the IDT electrode 30 can more reliably release heat to the high thermal conductive film 11 via the through electrode 13, and thus can further reduce or prevent accumulation of heat.

In a preferred embodiment, the dielectric film 7 is further provided between the support substrate 8 and the piezoelectric layer 2, and the through electrode 13 is in contact with the dielectric film 7. Therefore, in the manufacture of the acoustic wave device 1A, the piezoelectric layer 2 can be bonded to the support substrate 8 via the dielectric film 7, so that the acoustic wave device 1A can be easily manufactured.

The through electrode 13 may preferably be in contact with the support substrate 8. With the configuration, the IDT electrode 30 can also release heat to the support substrate 8 via the through electrode 13, and thus accumulation of heat can be further reduced or prevented.

In addition, a side electrode 14 provided on a surface of the piezoelectric layer 2 parallel or substantially parallel to the first direction is further included, and the side electrode 14 may be in contact with the wiring electrode 12 and the high thermal conductive film 11. Therefore, the IDT electrode 30 can release heat to the high thermal conductive film 11 via the wiring electrode 12 and the side electrode 14, and thus can further reduce or prevent accumulation of heat.

When the film thickness of the piezoelectric layer 2 is defined as d and the center-to-center distance between the adjacent electrodes 3 and 4 is defined as p, d/p may be, for example, equal to or less than about 0.5. As a result, the acoustic wave device 1 can be reduced in size and the Q value can be increased.

The Euler angles (φ, θ, ψ) of lithium niobate or lithium tantalate of the piezoelectric layer 2 may be in the range of the following Expression (1), (2) or (3). In this case, the fractional bandwidth can be sufficiently widened.

$$(0°\pm10°, 0° \text{ to } 20°, \text{arbitrary } \psi) \quad \text{Expression (1)}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(0-50)^2/900)^{1/2}] \text{ to } 180°) \quad \text{Expression (2)}$$

$$(0°\pm10°, [180°-30°(1-(\psi-90)^2/8100)^{1/2}] \text{ to } 180°, \text{arbitrary } \psi) \quad \text{Expression (3)}$$

The acoustic wave device 1 may be configured to utilize bulk waves in the thickness-shear mode. With the configuration, the coupling coefficient is increased, and excellent resonance characteristics can be obtained.

d/p may be, for example, equal to or less than about 0.24. As a result, the acoustic wave device 1 can be reduced in size and the Q value can be increased.

A region where the adjacent electrodes 3 and 4 overlap in a direction in which the two electrodes face each other may be the excitation region C, and when a metallization ratio of the plurality of electrodes 3 and 4 to the excitation region C is MR, MR≤about 1.75 (d/p)+0.075 is satisfied. In this case, the fractional bandwidth can be reliably set to equal to or less than about 17%.

The acoustic wave device 1 may be configured to utilize plate waves. As a result, excellent resonance characteristics can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a support substrate;

a piezoelectric layer including lithium niobate or lithium tantalate on the support substrate in a thickness direction of the support substrate, and including a main surface in the first direction;

a cavity portion between the support substrate and the piezoelectric layer;

an IDT electrode on the main surface of the piezoelectric layer and including a first busbar and a second busbar that face each other, a plurality of first electrode fingers each including a base end connected to the first busbar, and a plurality of second electrode fingers each including a base end connected to the second busbar;

a wiring electrode on the main surface of the piezoelectric layer and connected to the IDT electrode; and a high thermal conductive film in the piezoelectric layer in the thickness direction and having a thermal conductivity higher than a thermal conductivity of the piezoelectric layer; wherein at least a portion of the IDT electrode is provided in a region overlapping the cavity portion in a plan view in the first direction;

the high thermal conductive film is provided in a region overlapping the cavity portion in a plan view in the first direction; and the IDT electrode is connected to the high thermal conductive film directly or via a metal.

2. The acoustic wave device according to claim 1, wherein the high thermal conductive film includes at least one of alumina, silicon nitride, or aluminum nitride.

3. The acoustic wave device according to claim 1, wherein the high thermal conductive film includes silicon oxide.

4. The acoustic wave device according to claim 1, wherein the high thermal conductive film is also provided in a region that does not overlap the cavity portion in a plan view in the first direction.

5. The acoustic wave device according to claim 1, further comprising:

a through electrode penetrating the piezoelectric layer; wherein the through electrode is in contact with the high thermal conductive film and at least one of the IDT electrode and the wiring electrode.

6. The acoustic wave device according to claim 5, wherein the through electrode penetrates the high thermal conductive film.

7. The acoustic wave device according to claim 6, further comprising:

a dielectric film between the support substrate and the piezoelectric layer; wherein the through electrode is in contact with the dielectric film.

8. The acoustic wave device according to claim 7, wherein the dielectric film includes at least one of silicon oxide, silicon nitride, or alumina.

9. The acoustic wave device according to claim 6, wherein the through electrode is in contact with the support substrate.

10. The acoustic wave device according to claim 1, further comprising:

a side electrode on a surface of the piezoelectric layer parallel or substantially parallel to the thickness direction; wherein the side electrode is in contact with the wiring electrode and the high thermal conductive film.

11. The acoustic wave device according to claim 1, wherein when a film thickness of the piezoelectric layer is defined as d, and a center-to-center distance between a first electrode finger of the plurality of first electrode fingers and a second electrode finger of the plurality of second electrode fingers adjacent to each other is defined as p, d/p≤about 0.5 is satisfied.

12. The acoustic wave device according to claim 11, wherein the acoustic wave device is structured to utilize bulk waves in a thickness-shear mode.

13. The acoustic wave device according to claim 11, wherein d/p is equal to or less than about 0.24.

14. The acoustic wave device according to claim 11, wherein when a region where the first electrode finger and the second electrode finger adjacent to each other overlap when viewed in a direction in which the first electrode finger and the second electrode finger adjacent to each other face each other is referred to as an excitation region, a metallization ratio of the plurality of first electrode fingers and the plurality of second electrode fingers with respect to the excitation region is defined as MR, MR≤about 1.75 (d/p)+0.075 is satisfied.

15. The acoustic wave device according to claim 1, wherein

Euler angles (φ, θ, ψ) of lithium niobate or lithium tantalate of the piezoelectric layer are within a range defined by Expression (1), Expression (2), or Expression (3):

$$(0°\pm10°, 0° \text{ to } 20°, \text{arbitrary } \psi) \quad \text{Expression (1);}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad \text{Expression (2); and}$$

$$(0°\pm10°, [180°-30°(1-(\psi-90)^2/8100)^{1/2}] \text{ to } 180°, \text{arbitrary } \psi) \quad \text{Expression (3).}$$

16. The acoustic wave device according to claim 1, wherein the acoustic wave device is structured to utilize plate waves.

17. The acoustic wave device according to claim 1, wherein a thickness of the piezoelectric layer is equal to or more than about 50 nm and equal to or less than about 1000 nm.

18. The acoustic wave device according to claim 1, wherein a center-to-center distance between a first electrode finger of the plurality of first electrode fingers and a second electrode finger of the plurality of second electrode fingers adjacent to each other is equal to or more than about 1 μm and equal to or less than about 10 μm.

19. The acoustic wave device according to claim 1, wherein a width of each of the plurality of first electrode fingers and the plurality of second electrode fingers is equal to or more than about 150 nm and equal to or less than about 1000 nm.

20. The acoustic wave device according to claim 1, wherein the support substrate includes Si.

* * * * *